United States Patent
Hutton et al.

(10) Patent No.: US 8,997,029 B1
(45) Date of Patent: Mar. 31, 2015

(54) METHOD AND APPARATUS FOR IMPLEMENTING A FIELD PROGRAMMABLE GATE ARRAY ARCHITECTURE WITH PROGRAMMABLE CLOCK SKEW

(71) Applicant: Altera Corporation, San Jose, CA (US)

(72) Inventors: Michael D. Hutton, Mountain View, CA (US); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/132,332

(22) Filed: Dec. 18, 2013

Related U.S. Application Data

(62) Division of application No. 12/807,960, filed on Sep. 17, 2010, now Pat. No. 8,640,067, which is a division of application No. 11/102,069, filed on Apr. 8, 2005, now Pat. No. 7,818,705.

(51) Int. Cl.
   *G06F 17/50* (2006.01)
(52) U.S. Cl.
   CPC .................................. *G06F 17/5027* (2013.01)
   USPC .......................................................... 716/100
(58) Field of Classification Search
   CPC ........ G06F 17/5054; G06F 1/10; G06F 1/324
   USPC .......................................................... 716/100
   See application file for complete search history.

(56) References Cited

U.S. PATENT DOCUMENTS

| | | | |
|---|---|---|---|
| 5,373,535 A | 12/1994 | Ellis et al. | |
| 5,384,497 A | 1/1995 | Britton et al. | |
| 5,475,830 A | 12/1995 | Chen et al. | |
| 5,835,751 A | 11/1998 | Chen et al. | |
| 5,926,053 A | 7/1999 | McDermott et al. | |
| 6,377,912 B1 | 4/2002 | Sample et al. | |
| 6,434,731 B1 | 8/2002 | Brennan et al. | |
| 6,487,648 B1 | 11/2002 | Hassoun | |
| 6,550,045 B1 | 4/2003 | Lu et al. | |
| 6,594,807 B1 | 7/2003 | Tetelbaum et al. | |
| 6,651,224 B1 | 11/2003 | Sano et al. | |
| 6,657,456 B1 | 12/2003 | Jefferson et al. | |
| 6,668,363 B2 | 12/2003 | Minami et al. | |
| 6,742,133 B2 | 5/2004 | Saeki | |
| 6,904,471 B2 | 6/2005 | Boggs et al. | |
| 6,941,533 B2 | 9/2005 | Andreev et al. | |
| 6,941,540 B2 | 9/2005 | Kumagai | |
| 6,943,597 B1 | 9/2005 | Kaviani | |
| 6,944,833 B2 | 9/2005 | Jeon | |
| 6,952,813 B1 | 10/2005 | Rahut | |
| 6,954,917 B2 | 10/2005 | How et al. | |

(Continued)

OTHER PUBLICATIONS

Yeh, et al.: "Skew-programmable Clock Design for FPGA and Skew-aware Placement"; Feb. 20-22, 2005, ECE Department, University of California, Monterey, CA.

(Continued)

*Primary Examiner* — Sun Lin
(74) *Attorney, Agent, or Firm* — L. Cho

(57) ABSTRACT

A skew generator unit includes a delay chain. The delay chain is coupled to a clock line that transmits a clock signal. The delay chain generates a skewed clock signal having a unit of delay from the clock signal. The skew generator unit also includes a selector. The selector is coupled to the delay chain and the clock line and may select one of the clock signal and the skewed clock signal.

18 Claims, 15 Drawing Sheets

(56) References Cited

U.S. PATENT DOCUMENTS

| | | |
|---|---|---|
| 6,959,396 B2 | 10/2005 | Chen et al. |
| 7,032,198 B2 | 4/2006 | Sano et al. |
| 7,047,504 B2 | 5/2006 | Kawano |
| 7,071,751 B1 | 7/2006 | Kaviani |
| 7,107,477 B1 | 9/2006 | Singh |
| 7,117,143 B2 | 10/2006 | Wang et al. |
| 7,138,820 B2 | 11/2006 | Goetting et al. |
| 7,164,297 B2 | 1/2007 | Flynn |
| 7,194,718 B2 | 3/2007 | Sano et al. |
| 7,231,620 B2 | 6/2007 | Jang et al. |
| 7,290,162 B2 | 10/2007 | Swarbrick et al. |
| 7,818,705 B1 | 10/2010 | Hutton et al. |
| 8,572,530 B1 * | 10/2013 | Fung et al. .................. 716/108 |
| 2001/0010092 A1 | 7/2001 | Kato |
| 2003/0135836 A1 | 7/2003 | Chang et al. |
| 2003/0208736 A1 | 11/2003 | Teng et al. |
| 2004/0078766 A1 | 4/2004 | Andreev et al. |
| 2004/0103382 A1 | 5/2004 | Yamamoto |
| 2004/0155690 A1 | 8/2004 | Andrews et al. |
| 2004/0210857 A1 | 10/2004 | Srinivasan |
| 2004/0225984 A1 | 11/2004 | Tsao et al. |
| 2005/0050497 A1 | 3/2005 | Tetelbaum |
| 2005/0063503 A1 | 3/2005 | Nandy |
| 2005/0102643 A1 | 5/2005 | Hou et al. |
| 2005/0242836 A1 | 11/2005 | Goetting et al. |
| 2005/0278131 A1 | 12/2005 | Rifani et al. |
| 2006/0122806 A1 | 6/2006 | Rifani et al. |
| 2006/0129961 A1 | 6/2006 | Paul et al. |
| 2006/0136853 A1 | 6/2006 | Advani |
| 2006/0220697 A1 | 10/2006 | Flynn |
| 2006/0253821 A1 | 11/2006 | Kitahara et al. |
| 2007/0067686 A1 | 3/2007 | Khondker et al. |
| 2009/0183019 A1 * | 7/2009 | Allen et al. .................. 713/503 |
| 2010/0290571 A1 | 11/2010 | Castellano et al. |
| 2013/0002322 A1 | 1/2013 | Chung, II |
| 2013/0121094 A1 | 5/2013 | Zerbe et al. |

OTHER PUBLICATIONS

U.S. Appl. No. 12/807,960, filed Sep. 17, 2010, in Re Application of Hutton, et al.

* cited by examiner

METHOD AND APPARATUS FOR IMPLEMENTING A FIELD PROGRAMMABLE GATE ARRAY ARCHITECTURE WITH PROGRAMMABLE CLOCK SKEW

RELATED APPLICATIONS

This application is a divisional of and claims priority and benefit to U.S. application Ser. No. 12/807,960 filed on Sep. 17, 2010, entitled "METHOD AND APPARATUS FOR IMPLEMENTING A FIELD PROGRAMMABLE GATE ARRAY ARCHITECTURE WITH PROGRAMMABLE CLOCK SKEW" which is a divisional of, and claims priority and benefit to U.S. Pat. No. 7,818,705, filed on Apr. 8, 2005, entitled, "METHOD AND APPARATUS FOR IMPLEMENTING A FIELD PROGRAMMABLE GATE ARRAY ARCHITECTURE WITH PROGRAMMABLE CLOCK SKEW".

FIELD

Embodiments of the present invention relate to clocking networks on field programmable gate arrays (FPGAs). More specifically, embodiments of the present invention relate to a method and apparatus for implementing a FPGA architecture with programmable clock skew.

BACKGROUND

When designing a system on an FPGA, one primary objective is to clock the system at its fastest speed. Clock speed is limited by the longest register to register path delay in the design. A circuit is operational with respect to register setup if the time for data to propagate between registers is less than the clock period of the clock which clocks the registers. If the speed of a clock is such that a destination register latches data before the data is propagated from its source, the circuit will fail to operate.

In a large circuit, there is a range of different delays between each source and destination register. In the past, designers have attempted to optimize a clocking network by utilizing register re-timing techniques to affect the longest delay of a data path. Register re-timing involves moving sequential elements, such as registers, forward and backwards in a logic design. Register re-timing may create or delete registers in the design and change the temporal behavior of some internal registers while leaving the functionality of the design intact. When performed appropriately, register re-timing balances the paths between registers to decrease the worst-case delay.

Register re-timing, however, suffers the drawback of being difficult to implement in a design flow. Register re-timing is difficult to perform early in the design flow because it relies on estimates of timing which are inaccurate in the early stages of the design flow. Register re-timing is also difficult to perform late in the design flow because it requires replacing or modifying a netlist generated during synthesis which introduces further complications.

Thus, what is needed is an improved method and apparatus for designing a circuit to allow the circuit to operate at its fastest clock speed.

SUMMARY

According to an embodiment of the present invention, the performance of a design implemented on an FPGA may be improved by adjusting the clock phase of components in the FPGA to allow for a faster clocking of the design. The clock phase is adjusted by adding clock skew to one or more components on a path in the system and subtracting clock skew from one or more components in the path. According to one embodiment, programmable delays are added into existing switch points in a clock tree on the FPGA.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

Figure 1A:
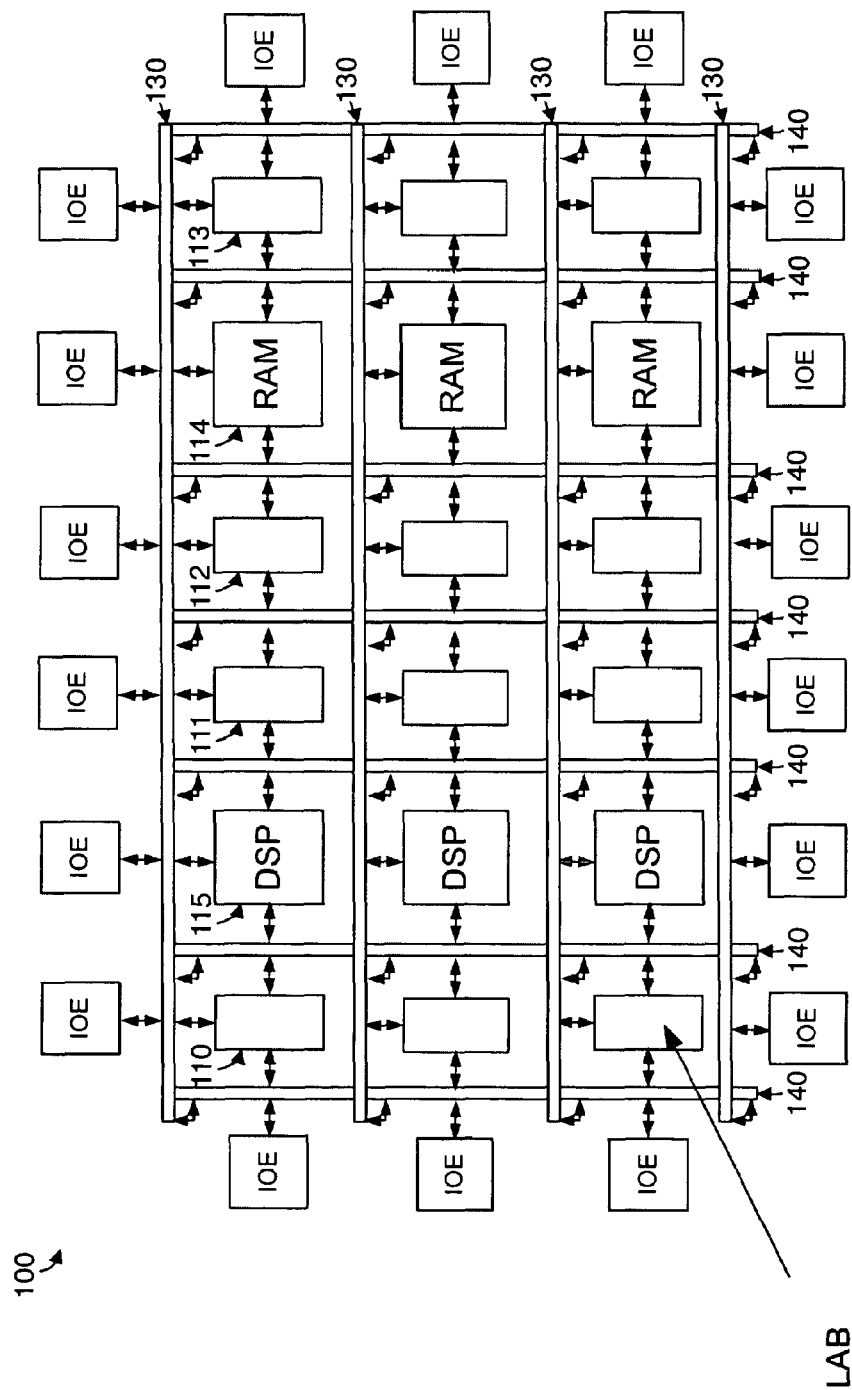
FIG. 1A illustrates an FPGA according to an embodiment of the present invention.

FIG. 1A illustrates a portion of an exemplary target device 100 according to an embodiment of the present invention. The present invention may be implemented on the target device 100. According to one embodiment, the target device 100 is an FPGA chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 100, an LE may include a 4-input lookup table (LUT) with a configurable flip-flop.

The target device 100 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 100. Columns of LABs are shown as 110-113.

The target device 100 includes memory blocks. The memory blocks may be, for example, dual port random access memory (RAM) blocks that provide dedicated true dual-port, simple dual-port, or single port functionality for various bit widths and depths. The memory blocks may be grouped into columns across the target device in between selected LABs or located individually or in pairs within the target device 100. A column of RAM blocks is shown as 114.

The target device 100 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 100. A column of DSP blocks is shown as 115.

The target device 100 includes a plurality of input/output elements (IOEs). Each IOE connects to an I/O pin (not shown) on the target device 100. The IOEs are located at the end of LAB rows and columns around the periphery of the target device 100. Each IOE includes a bidirectional I/O buffer and a plurality of registers for registering input, output, and output-enable signals. It should be appreciated that the target device 100 may include any number of these and other functional blocks.

The target device 100 includes LAB local interconnect lines that transfer signals between LEs in the same LAB. Some LAB local interconnect lines are driven by column and row interconnects and LE outputs within the same LAB. Neighboring LABs, memory blocks, IOEs, or DSP blocks may also drive the LAB local interconnect lines through direct link connections.

The target device 100 includes a plurality of row non-local interconnect lines ("H-type wires") 130 that span fixed distances. Row interconnect lines 130, that include H4 131, H8 132, and H24 133 interconnects, may be used to route signals to and from LABs, DSP blocks, IOEs, and memory blocks within the same row. The H4 131, H8 132, and H24 133 interconnects span a distance of up to four, eight, and twenty-four logical units respectively. The row interconnects 130 may drive and be driven by LABs, DSP blocks, RAM blocks, and horizontal IOEs.

The target device 100 includes a plurality of column non-local interconnect lines ("V-type wires") 140 that operate similarly to the row interconnect lines 130. The column interconnect lines 140 may be used to vertically route signals to and from LABs, memory blocks, DSP blocks, and IOEs. These column interconnect lines 140 include V4 141, V8 142, and V16 143 interconnects that traverse a distance of four, eight, and sixteen logical units respectively, in a vertical direction. In general, the distinction between local and non-local interconnect is that local interconnect lines only span one logical location, while non-local interconnect lines span more than one logical location.

Figure 1B:
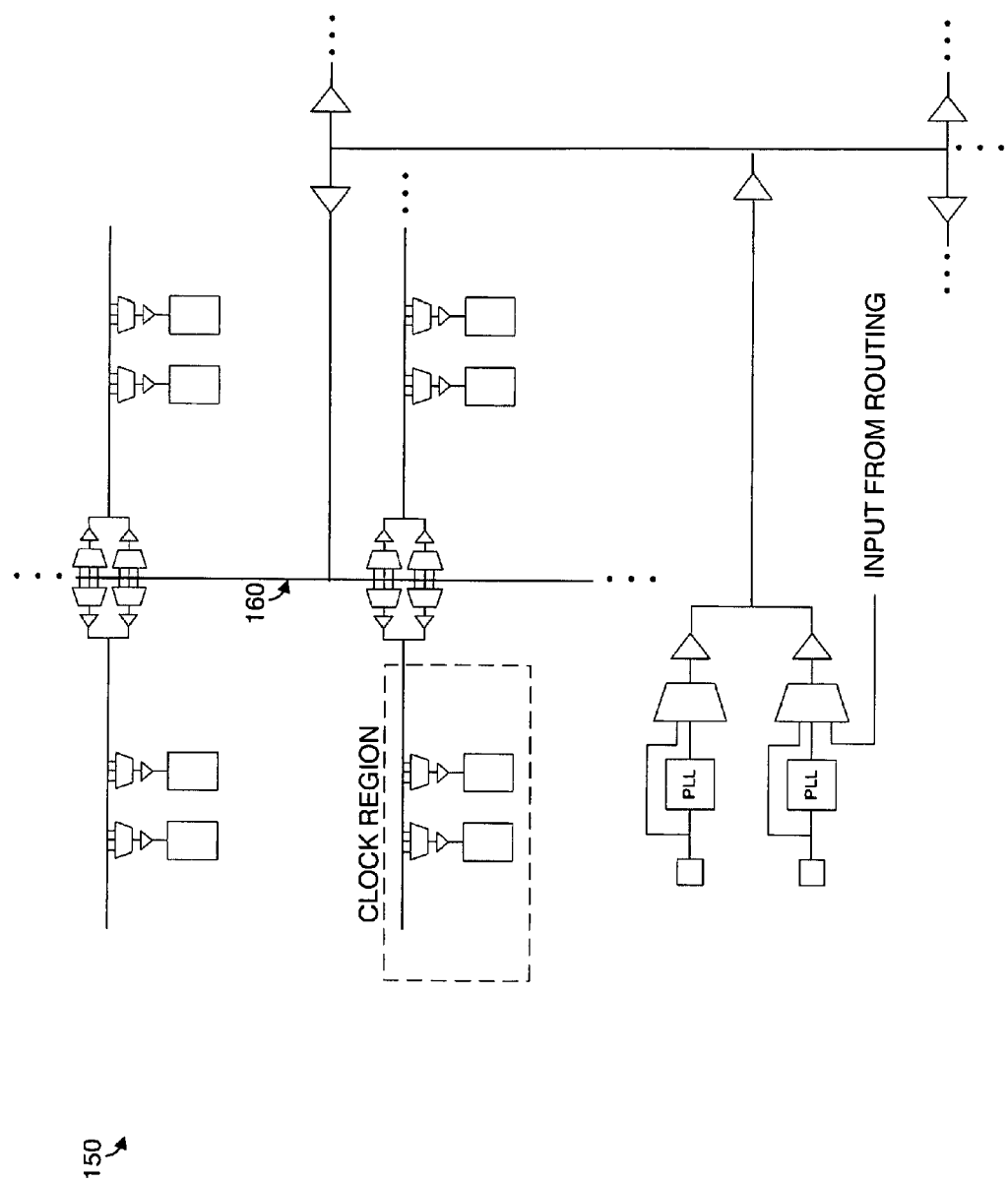
FIG. 1B illustrates a clocking network that may be implemented on the FPGA shown in FIG. 1A.

FIG. 1B illustrates a clocking network 150 that may be implemented on the target device 100 shown in FIG. 1A. The clocking network 150 distributes one or more clock signals across a region of the die, possibly including the entire die. FIG. 1B illustrates a clock tree 160 organized as an H-tree. The H-tree includes one or more clock signals, which may be driven by various sources, including IO pins or other clock generation circuits such as PLLs, or user signals from the routing fabric of the FPGA. Different clock signals may enter at various places on the H-tree, corresponding to driving regions of various sizes in the FPGA. According to an embodiment of the present invention, each clock signal may be buffered to be distributed with minimal skew across some region of the FPGA. Within some regions of the FPGA including one or more LABs, multiplexers select one or more clock signals that are driven on a local clock region. Each LAB in the clock region (if more than one) may select one or more of the clocks from that clock region.

A portion of the clocking network is shown as 150. The clocking network 150 may be a dedicated network that spans the entire area of the chip ("chip-wide network"), a dedicated network that spans a portion of the entire area of the chip ("local network"), or a combination of both. The clocking network 150 may be used to distribute clocks signals to components on the target device 100 such as registers on LABs. It should be appreciated that FIG. 1 illustrates only a portion of a clocking network, and that a target device 100 may include a plurality of clocking networks. According to an embodiment of the present invention, the clocking network 150 may be programmed to introduce skew onto clock signals on the target device 100. The skew may be utilized to improve the performance of the target device 100.

FIG. 1 illustrates an exemplary embodiment of a target device. It should be appreciated that a system may include a plurality of target devices, such as that illustrated in FIG. 1, cascaded together. It should also be appreciated that the target device may include elements arranged in a manner different than in the target device 100. A target device may also include components other than those described in reference to the target device 100. Thus, while the invention described herein may be utilized on the architecture described in FIG. 1, it should be appreciated that it may also be utilized on different architectures, such as those employed by Altera® Corporation in its APEX™, Stratix™, Cyclone™, Stratix™ II, and Cyclone™ II families of chips and those employed by Xilinx® Inc. in its Virtex™ and Virtex™ II, and Virtex IV™ line of chips.

Figure 2:
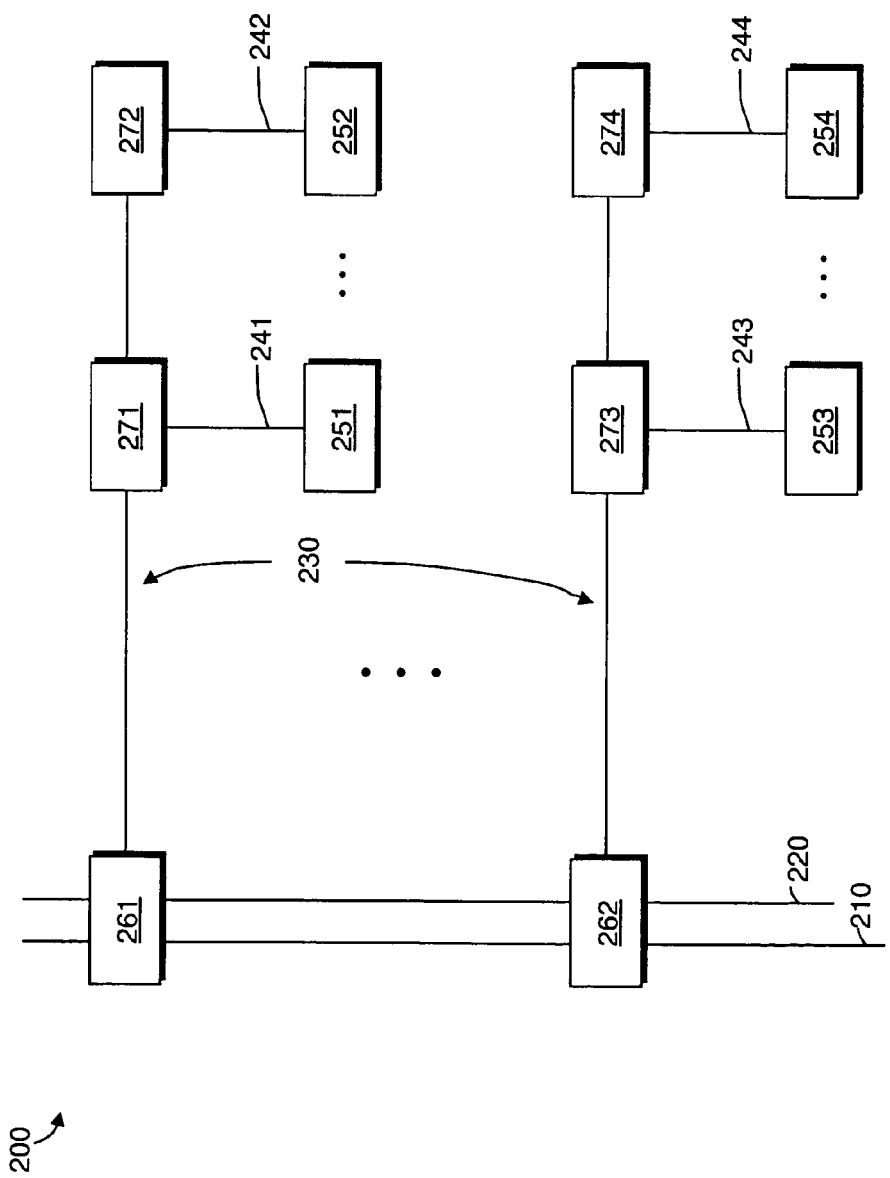
FIG. 2 illustrates a section of a clocking network according to an embodiment of the present invention.

FIG. 2 illustrates a section of a clocking network 200 according to an exemplary embodiment of the present invention. The clocking network 200 may be used to implement the clocking network 150 shown in FIG. 1. The clocking network 200 includes a plurality of global clock lines 210 and regional clock lines 220 that represent a first level of hierarchy in the clocking network 200. Each global clock line is coupled to a global clock generator (not shown) and distributes a clock signal generated by the global clock generator throughout a target device. Each regional clock line is coupled to a regional clock generator (not shown) and distributes a clock signal generated by the clock generator to a subset region on the target device. In one embodiment, each clock generator may generate a clock signal that is unique. The clocking network 200 includes a plurality of row clock lines 230 that represent a second level of hierarchy in the clocking network 200. Each row clock line may receive a clock signal from one of the global clock lines 210 or regional clock lines 220 and distribute the clocking signal along a row in the target device. The clocking network 200 includes a plurality of LAB clock lines 241-244 that represent a third level of hierarchy in the clocking network 200. Each LAB clock line may receive a clocking signal from one of the row clock lines 230 and distribute the clocking signal along the LAB clock line to a LAB. LAB clock lines 241-244 may distribute clock signals to LABs 251-254 respectively.

The clocking network 200 includes a plurality of skew generator systems 261-262, and 271-274. The skew generator systems 261-262, and 271-274 are shown to reside at switch points where clock signals are transmitted from one level of hierarchy in the clocking network 200 to another. The skew generator systems 261-262, and 271-274 operate as clock selectors by selecting a clocking signal to transmit from one level of hierarchy in the clocking network 200 to another level of hierarchy in the clocking network 200. The skew generator systems 261-262, and 271-274 may also operate to introduce skew onto one or more clock signals originating from one or more of the hierarchies in the clocking network 200. According to an embodiment of the clocking network 200, a skew generator system includes a plurality of skew generator units. A skew generator unit may include one or more discrete programmable delay elements that may be coupled to a clock line transmitting a clock signal that generates a skewed clock signal. The skew generator unit also includes a selector coupled to the one or more discrete programmable delay elements and the clock line to select either the clock signal or a skewed clock signal to transmit to another hierarchy in the clocking network.

The clocking network 200 is shown to include three levels of hierarchy of clock lines. It should be appreciated that the clocking network 200 may be implemented using fewer or additional levels of hierarchy of clocking lines and utilize additional skew generator systems at additional switching points to select and transmit clocking signals between the levels of hierarchy of clocking lines.

In the embodiment shown, the global clock lines 210 and the regional clock lines 220 are in the same level of hierarchy in the clocking network 200 and both feed row clock lines 230 which are in a different level of the hierarchy. It should be appreciated that the global clock lines 210 and the regional clock lines 220 may also be implemented such that they are in different hierarchies, or in different parts of one or more hierarchies. In this embodiment, the global clock lines 210 would feed the regional clock lines 220. The regional clock lines would then feed the row clock lines 230. It should be appreciated that embodiments of the skew generator system may be implemented on clocking networks having any variety of hierarchies and architecture.

Figure 3:
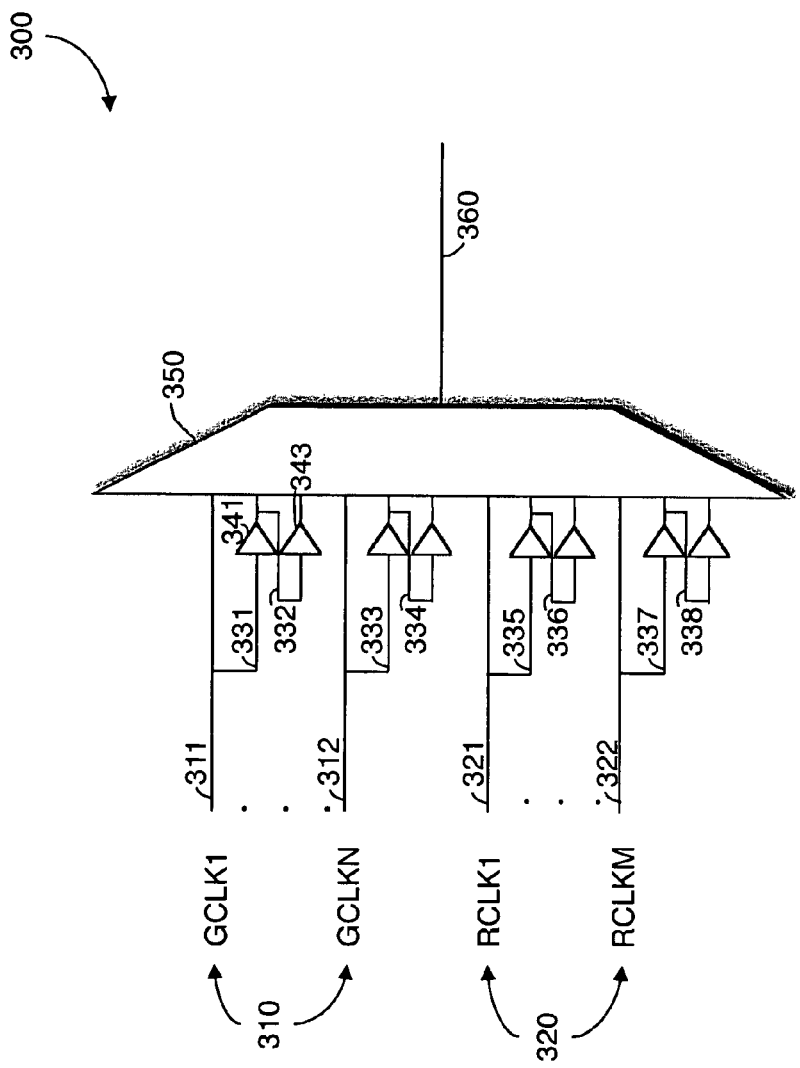
FIG. 3 illustrates a skew generator unit at a first switch point according to an embodiment of the present invention.

FIG. 3 illustrates a skew generator unit 300 at a first switch point according to an embodiment of the present invention. The skew generator unit 300 may be used to implement either skew generator system 261 or 262 (shown in FIG. 2) at a switch point where a clock signal is transmitted from the first level of hierarchy of the clocking network 200 (shown in FIG. 2) to the second level of hierarchy of the clocking network 200. The skew generator unit 300 is coupled to a plurality of global clock lines 310. Global clock line 311 represents a first global clock line and global clock line 312 represents an nth global clock line, where n can be any number. The skew generator unit 300 is coupled to a plurality of regional clock lines 320. Regional clock line 321 represents a first regional clock line and regional clock line 322 represents an mth global clock line, where m can be any number. The skew generator unit 300 includes a plurality of delay chains. The delay chains receive clock signals and introduce discrete units of skew to the clock signals. A first delay chain 331 is coupled to global clock line 311. The first delay chain 331 includes a delay element 341 that operates to introduce a first unit of skew to clock signals from the global clock line 311. The skew generator unit 300 includes a second delay chain 332 coupled to the first delay chain 331. The second delay chain 332 includes delay element 343 that operate to introduce a second unit of skew to clock signals. Delay chains 333-338 operate similarly. The skew generator 300 includes a selector 350. The selector 350 is coupled to the global clock lines 310, the regional clock lines 320, and delay chains 331-338. The selector 360 selects clock signals from one of the clock lines and delay chains to transmit onto a row clock line 360.

Figure 4:
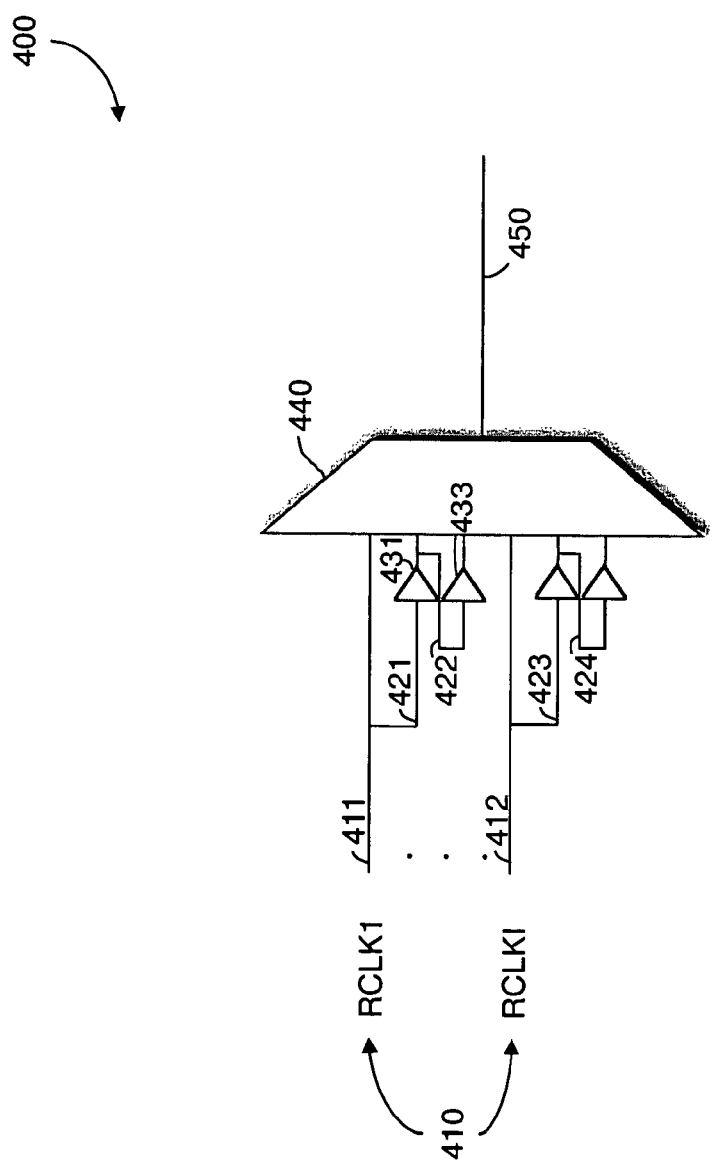
FIG. 4 illustrates a skew generator unit at a second switch point according to an embodiment of the present invention.

FIG. 4 illustrates a skew generator unit 400 at a second switch point according to an embodiment of the present invention. The skew generator unit 400 may be used to implement the skew generator systems 251-254 (shown in FIG. 2) at a switch point where a clock signal is transmitted from the second hierarchy of the clocking network 200 (shown in FIG. 2) to the third hierarchy of the clocking network 200. The skew generator unit 400 is coupled to a plurality of row clock lines 410. Row clock line 411 represents a first row clock line and row clock line 412 represents an ith global clock line, where i can be any number. The skew generator unit 400 includes a plurality of delay chains coupled to the row clock lines 410. The delay chains receive clock signals and introduce discrete units of skew to the clock signals. A first delay chain 421 is coupled to row clock line 411. The first delay chain 421 includes a delay element 431 that operates to introduce a first unit of skew to clock signals from the row clock line 411. The skew generator unit 400 includes a second delay chain 422 coupled to the first delay chain 421. The second delay chain 422 includes delay element 433 that operate to introduce a second unit of skew to clock signals from the first delay chain 421. Delay chains 423-424 operate similarly. The skew generator 400 includes a selector 440. The selector 440 is coupled to the row clock lines 410 and the delay chains 421-424. The selector 440 selects a clock signal from one of the clock lines and delay chains to transmit onto a LAB clock line 450.

Figure 5A:
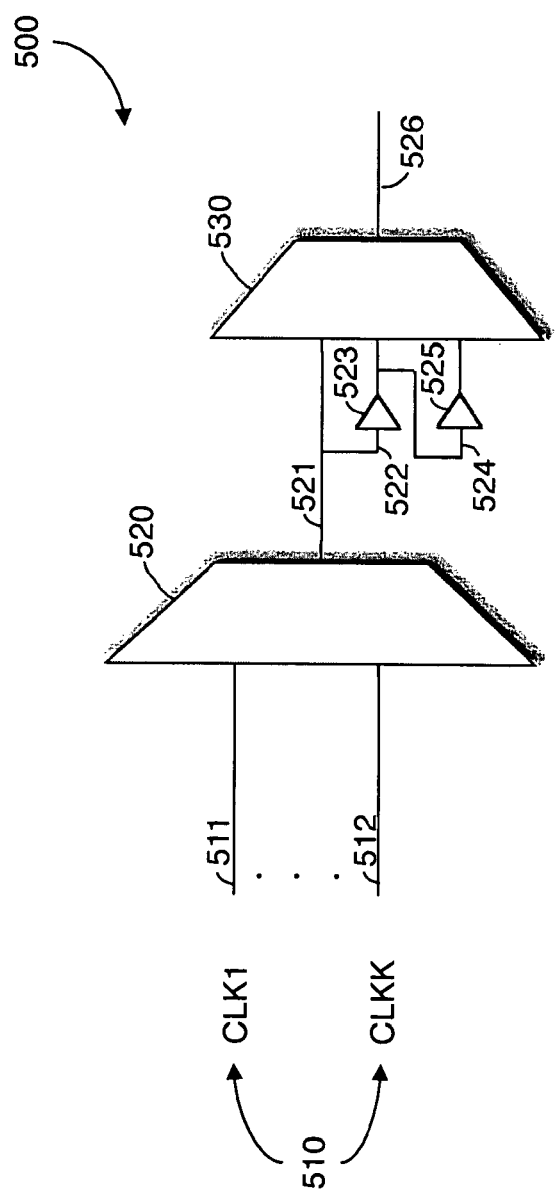
FIG. 5A illustrates a skew generator unit according to an alternate embodiment of the present invention.
Figure 5B:
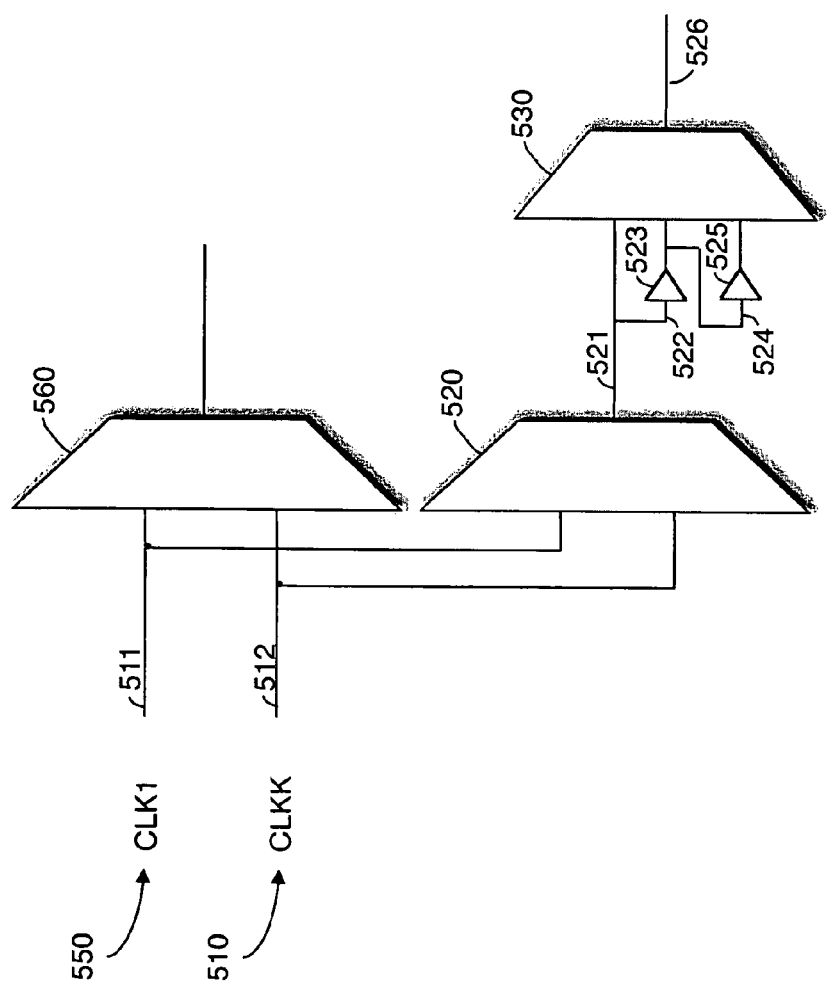
FIG. 5B illustrates an embodiment of a skew generator unit with a priority multiplexer.

FIG. 5A illustrates a skew generator unit 500 according to an alternate embodiment of the present invention. The skew generator unit 500 may be implemented at a switch point where a clock signal is transmitted from one level of hierarchy of a clocking network to another. The skew generator unit 500 may be implemented on the global clock lines 210, regional clock lines 220, or row clock lines 230 (all shown in FIG. 2). The skew generator unit 500 is coupled to a plurality of clock lines 510. Clock line 511 represents a first clock line and clock line 512 represents a kth clock line, where k can be any number. A first selector 520 performs clock selection. The selected clock signal is transmitted onto clock line 521. The skew generator unit 500 includes a plurality of delay chains 522 and 524. The delay chains 522 and 524 introduce discrete units of skew to the clock signals on clock line 521. The skew generator 500 includes a second selector 530. The second selector 530 is coupled to the clock line 521 and the delay chains 522 and 524. The second selector 530 may select clock signals with an appropriate amount of delay to transmit onto clock line 526. According to an embodiment of the present invention, the skew generator unit 500 may be implemented on a LAB clock line. In this embodiment, the skew generator unit 500 is coupled to a single LAB clock line and the selector 530 selects a single clock signal. FIG. 5B illustrates an embodiment of a skew generator unit 550 where a priority multiplexer 560 is used, such that the non-delayed versions of a clock may have minimal delay through the skew generator 550, in order to minimize the total clock insertion delay.

According to an embodiment of the present invention, programmable skew may be introduced in FPGAs by utilizing clock multiplexing structures already present and used in typical FPGA devices. For example, the selectors shown in the skew generator units in FIGS. 3-4 may be implemented using clock multiplexing structures available on FPGAs. FIGS. 3-5 illustrate exemplary embodiments of skew generator units that generate skew for all clock signals on clock lines coupled to the skew generator units. It should be appreciated that other configurations may also be implemented.

Figure 6:
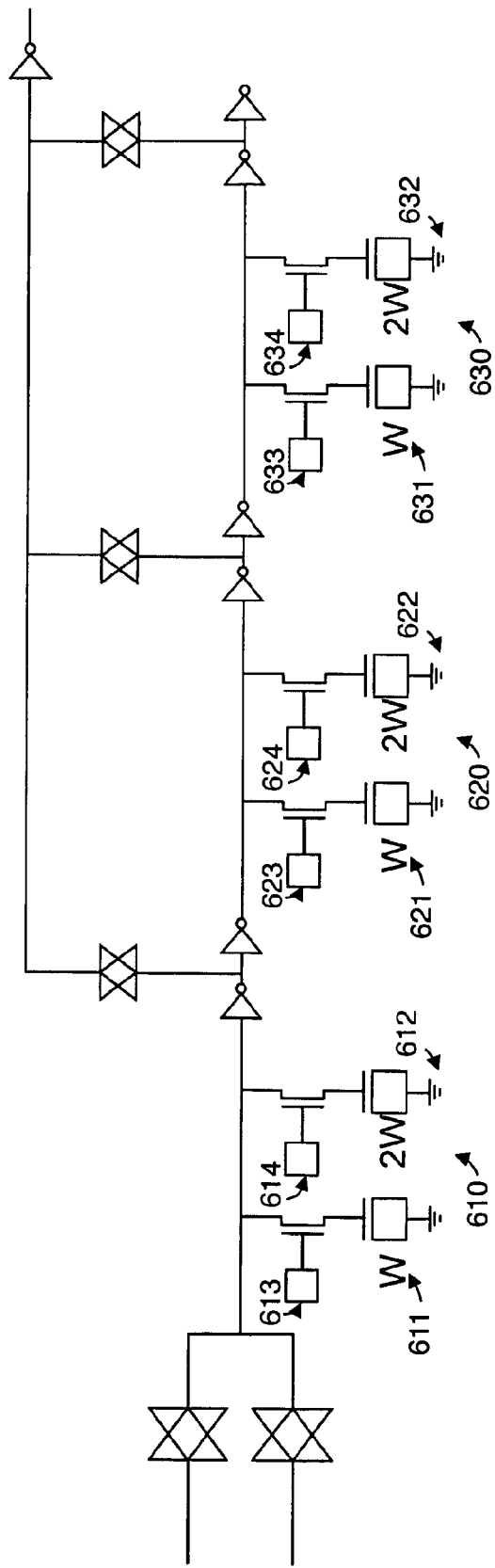
FIG. 6 illustrates an exemplary programmable delay chain according to an embodiment of the present invention.

FIG. 6 illustrates an exemplary skew generator unit 600 according to an embodiment of the present invention. The skew generator unit 600 includes a 3 stage delay chain. Each of the stages 610, 620, and 630 is implemented with a pair of MOS load capacitors 611-612, 621-622, and 631-632 respectively. The MOS load capacitors 611-612, 621-622, and 631-632 are enabled by MOS switches 613-614, 623-624, and 633-634 respectively. The skew generator unit 600 requires one CRAM per delay configuration. If N programmable loads are implemented in each stage, up to $2^N$ distinct delays can be provided in each stage.

It should be appreciated that delay chains in skew generator units may also be implemented with inverters with transistor sizes chosen for suitable delay as well as with current-starved transistors. According to one embodiment, the delay in the delay chains is not compensated for process, voltage or temperature variation. In another embodiment, control signals generated by a delay locked loop or other technique for monitoring the process, voltage or temperature variation are distributed to one or more delay chains to allow more accurate tracking. In designing a delay chain, considerations that may be taken include the minimization of the area required for the chain and the tracking between the delay in the delay chain and corresponding delays in the logic and routing that are used by the FPGA.

Figure 7A:
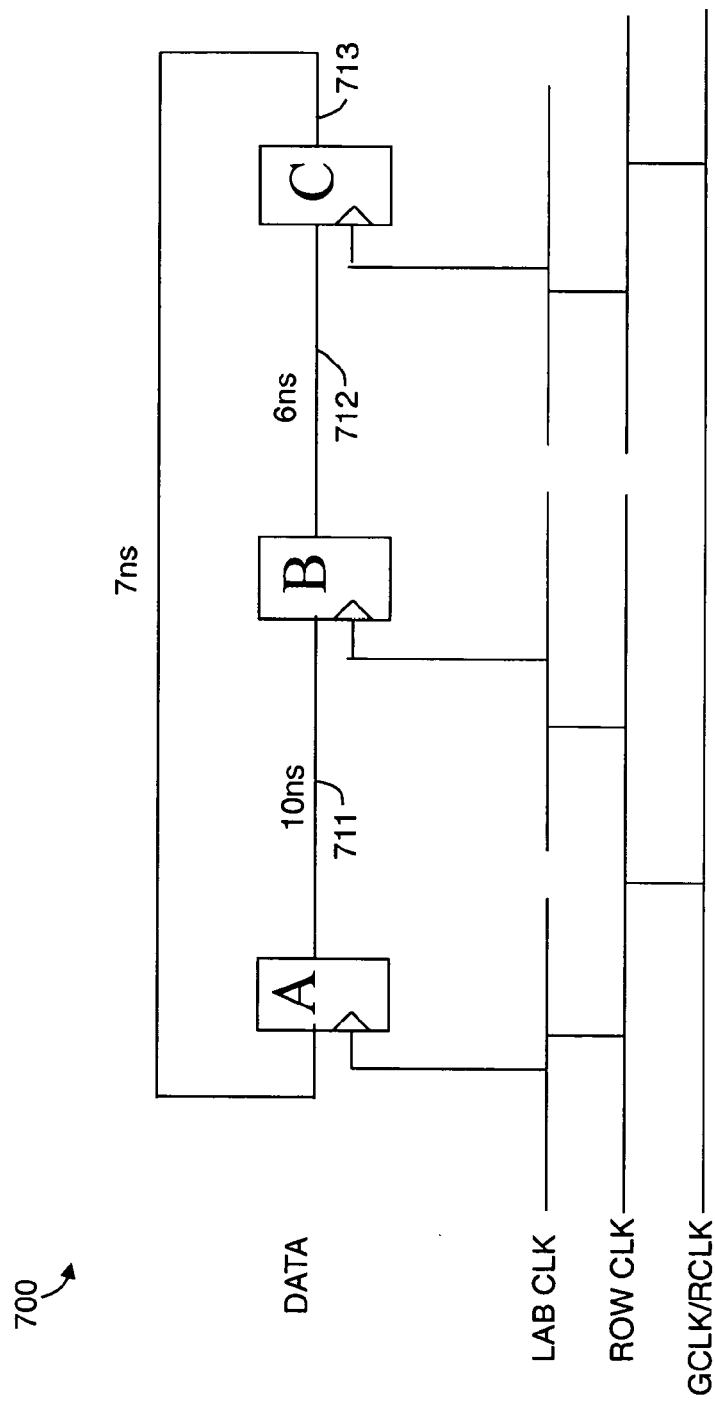
FIG. 7A illustrates an exemplary cyclic sequential machine which could benefit from programmable skew.

FIG. 7A illustrates an example of a cyclic sequential machine 700. A cyclic sequential machine comprises a set of registers and combinational paths between the registers, such that there is at least one path through the logic and registers that forms a cycle. Cyclic sequential machines are of particular importance because they have fundamental constraints on their performance, whereas an acyclic sequential machine can potentially be pipelined or use clock skew with fewer constraints. The cyclic sequential machine 700 includes 3 registers, A, B, and C. Data path 711 between registers A and B requires 10 ns. Data path 712 between registers B and C requires 6 ns. Data path 713 between registers C and A requires 7 ns. In this example, if a clock transmitting clock signals to registers A, B, and C is run at 9 ns the cyclic sequential machine 700 will fail to operate because the data transfer between registers A and B requires 10 ns. Data from register A to register B will arrive too late to be latched by the clock. The slack for the register paths in the cyclic sequential machine 700 can be computed with the following relationship.

Slack=Clock Period+Skew−Data Delay

Since there is no skew in the cyclic sequential machine 700, the following slack values are computed for the register paths.

Slack(*AB*)=9+0−10=−1 (Circuit Will Not Function)

Slack(*BC*)=9+0−6=3

Slack(*CA*)=9+0−7=2

Figure 7B:
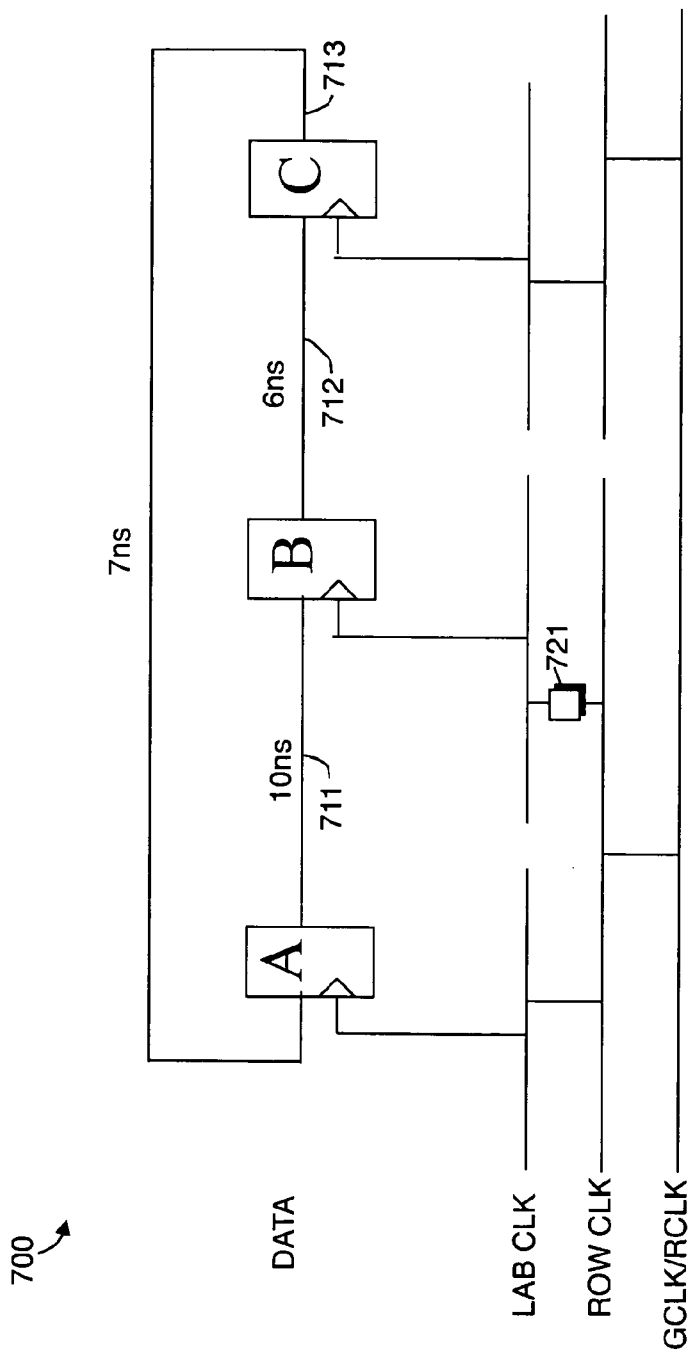
FIG. 7B illustrates the exemplary cyclic sequential machine of FIG. 7A with programmable skew applied according to an embodiment of the present invention.

FIG. 7B is an example of how programmable skew may be applied to the cyclic sequential machine 700 according to an embodiment of the present invention. Skew on a clock line occurs when the electrical delay for a clock path to one register differs from its delay to another register. A 1 ns delay is introduced on the clock path between A and the clock signal that feeds registers B and C as represented by delay unit 721 at a switching point between a row clock line (ROW CLK) associated with registers A and B and a LAB clock line (LAB CLK) associated with register B. This results in generating a positive skew of 1 ns between registers A and B, and between A and C. There is no skew between registers B and C since they see the clock signal at the same time. There is a negative skew of −1 ns present between registers C and A.

The skew introduced to the cyclic sequential machine 700 as shown in FIG. 7B changes the timing of the circuit. The clock is delayed by 1 ns between registers A and B. Thus, a 10 ns data path may be correctly clocked by a 9 ns clock because the data delay launched on the rising clock edge at time 0 ns will arrive at time 10 ns on register B's data input. The next clock edge, intended to latch the data in register B at time 9 ns will instead reach B at time 10 ns because of the skew. Thus, the data from register A to register B arrives on time relative to the clock which latches it.

The following slack values are computed for the register paths with the skew introduced to the cyclic sequential machine 700 as shown in FIG. 7B.

Slack(*AB*)=9+1−10=0

Slack(*BC*)=9+0−6=3

Slack(*CA*)=9+(−1)−7=1

Figure 7C:
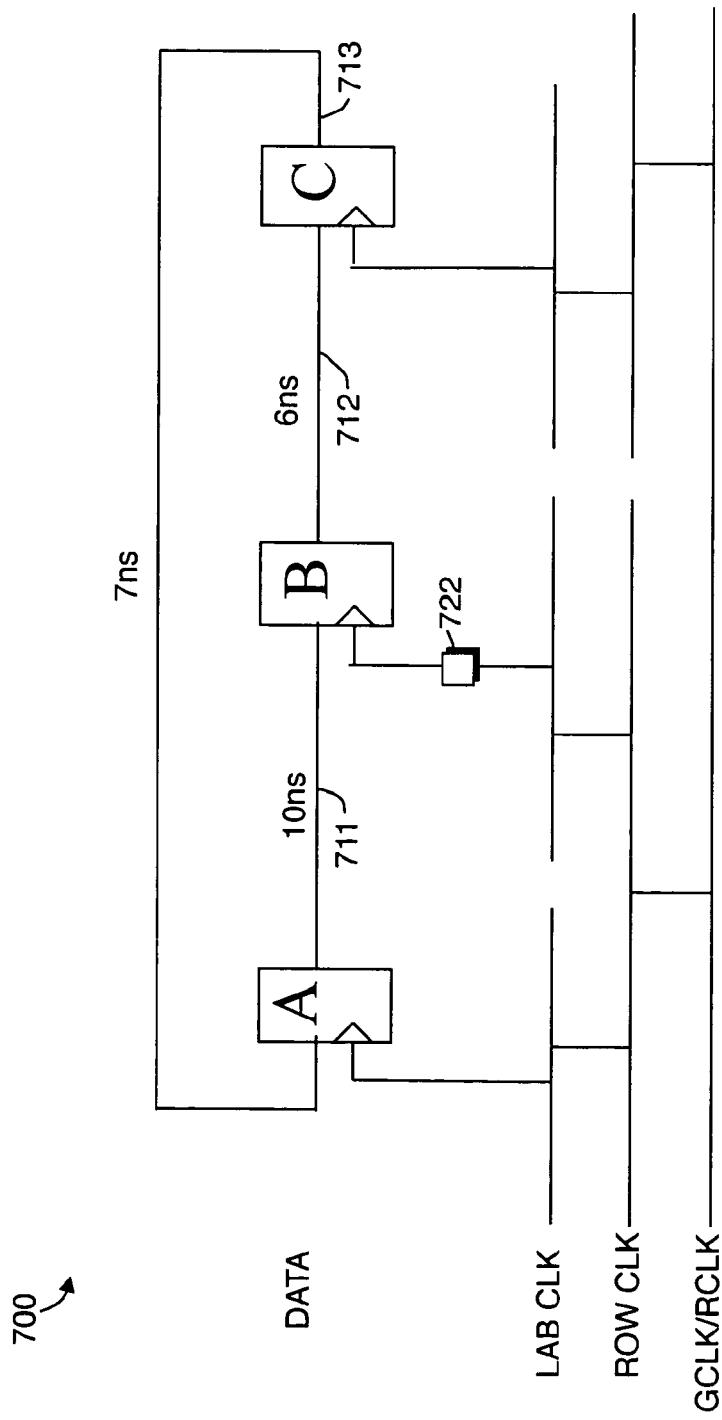
FIG. 7C illustrates the exemplary cyclic sequential machine of FIG. 7A with programmable skew applied according to a second embodiment of the present invention.

FIG. 7C is an example of how programmable skew may be applied to the cyclic sequential machine 700 according to a second embodiment of the present invention. In this embodiment, a 1 ns delay is introduced on the clock path between A and the clock signal that feeds registers B and C as represented by delay unit 722 on a LAB clock line (LAB CLK) feeding register B. This results in generating a positive skew of 1 ns between registers A and B. There is no skew between registers A and C, and C and A since they see the clock signal at the same time. There is a negative skew of −1 ns present between registers B and C.

The following slack values are computed for the register paths with the skew introduced to the cyclic sequential machine 700 as shown in FIG. 7C.

Slack(*AB*)=9+1−10=0

Slack(*BC*)=9+(−1)−6=2

Slack(*CA*)=9+0−7=2

Figure 8A:
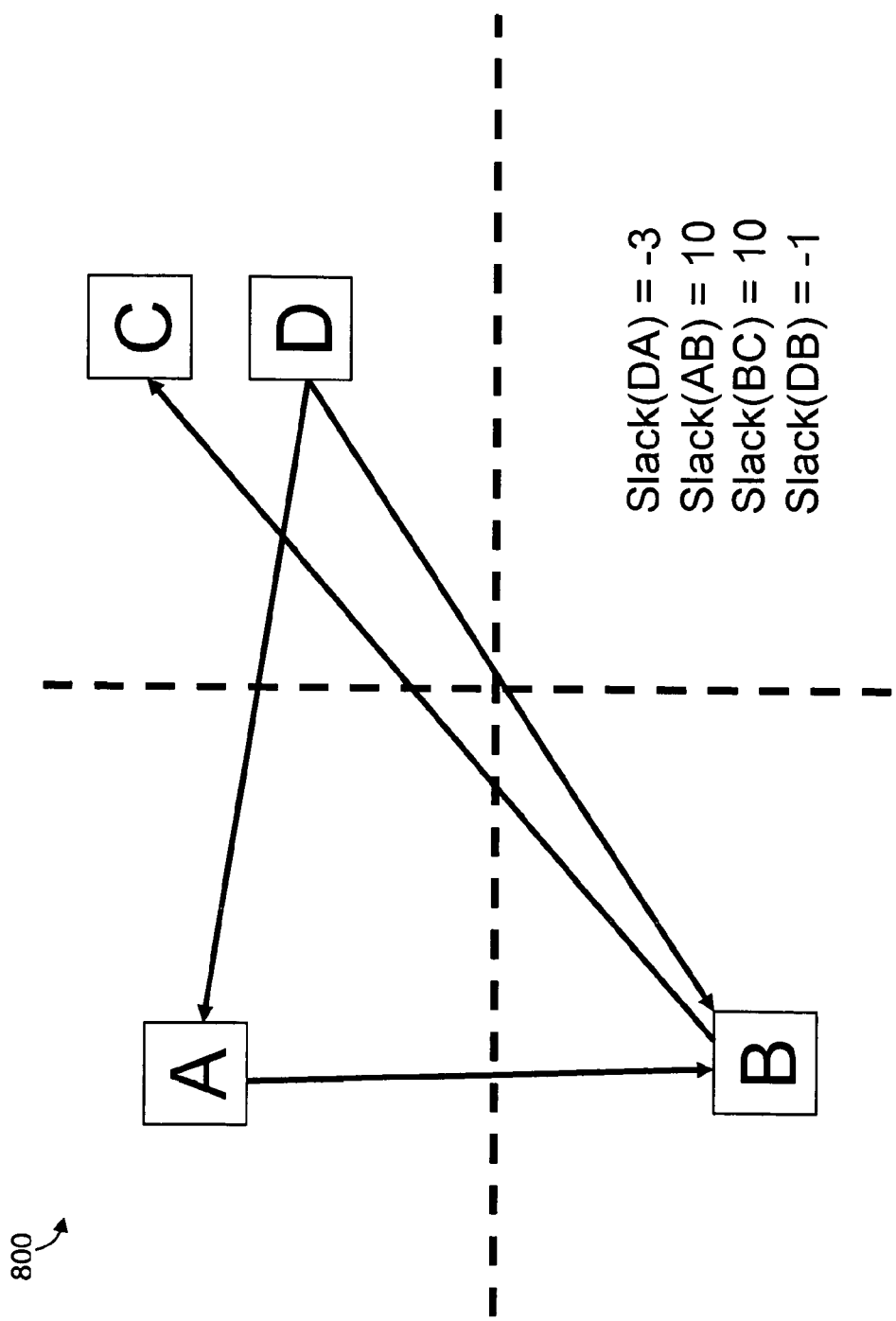
FIG. 8A illustrates a second exemplary cyclic sequential machine which could benefit from programmable skew.

FIG. 8A illustrates a second exemplary cyclic sequential machine 800 which could benefit from programmable skew. In this example, there are 4 levels of hierarchy in the cyclic sequential machine 800. Global clock lines that span the target device represent a first level of hierarchy in the clocking network. Quadrant clock lines that span a quarter of the target device and that select clock signals from the global clock lines represent a second level of hierarchy in the clocking network. Row clock lines that are grouped in each quadrant that select clock signals from the quadrant clock lines represent a third level of hierarchy in the clocking network. LAB clock lines that select clock signals from the row clock lines represent a fourth level of hierarchy in the clocking network.

The cyclic sequential machine 800 includes four registers, A, B, C, and D. The slack on the resulting paths between the registers at the current clock speed are shown in FIG. 8. The cyclic sequential machine 800 is not operational at the current clock speed because the slack values on the path between registers D and A, and D and B are negative.

Figure 8B:
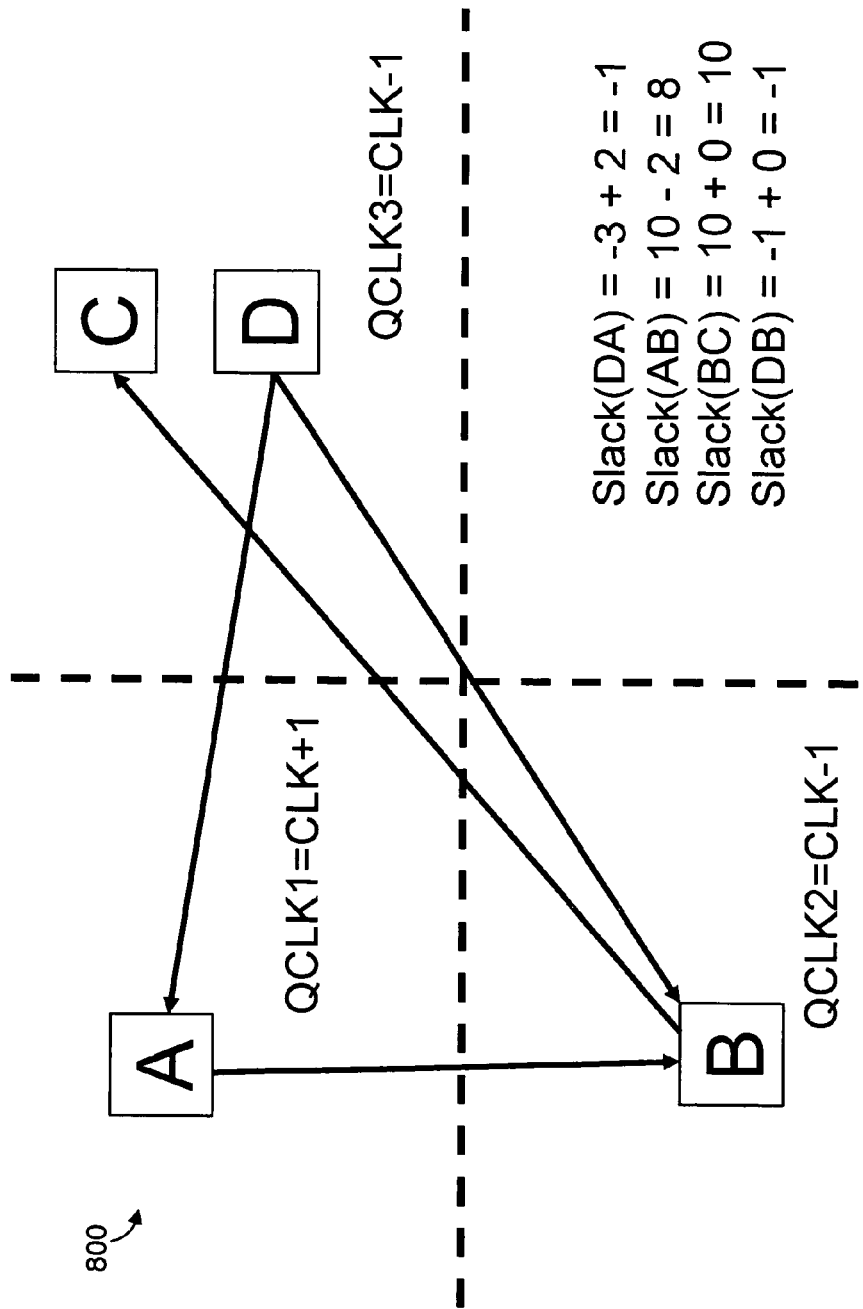
FIG. 8B illustrates the exemplary cyclic sequential machine of FIG. 8A with programmable skew applied at a first hierarchy of the clocking network according to an embodiment of the present invention.

FIG. 8B illustrates the exemplary cyclic sequential machine of FIG. 8A with programmable skew applied at a first hierarchy of the clocking network according to an embodiment of the present invention. In this embodiment, +1, −1, and −1 units of skew are introduced onto the quadrant clock lines in quadrants 1, 2, and 3 respectively. This results in the generation of beneficial skew of +2 between quadrant 3 and quadrant 1. The slack on the path between registers D and A improves from −3 to −1. Detrimental skew of −2 is generated between quadrants A and B. The slack on the path between registers A and B drops from 10 to 8. The slack on the path between registers B and C, and D and B is 0 because quadrant clocks corresponding to these pairs of registers were modified by the same amount.

Figure 8C:
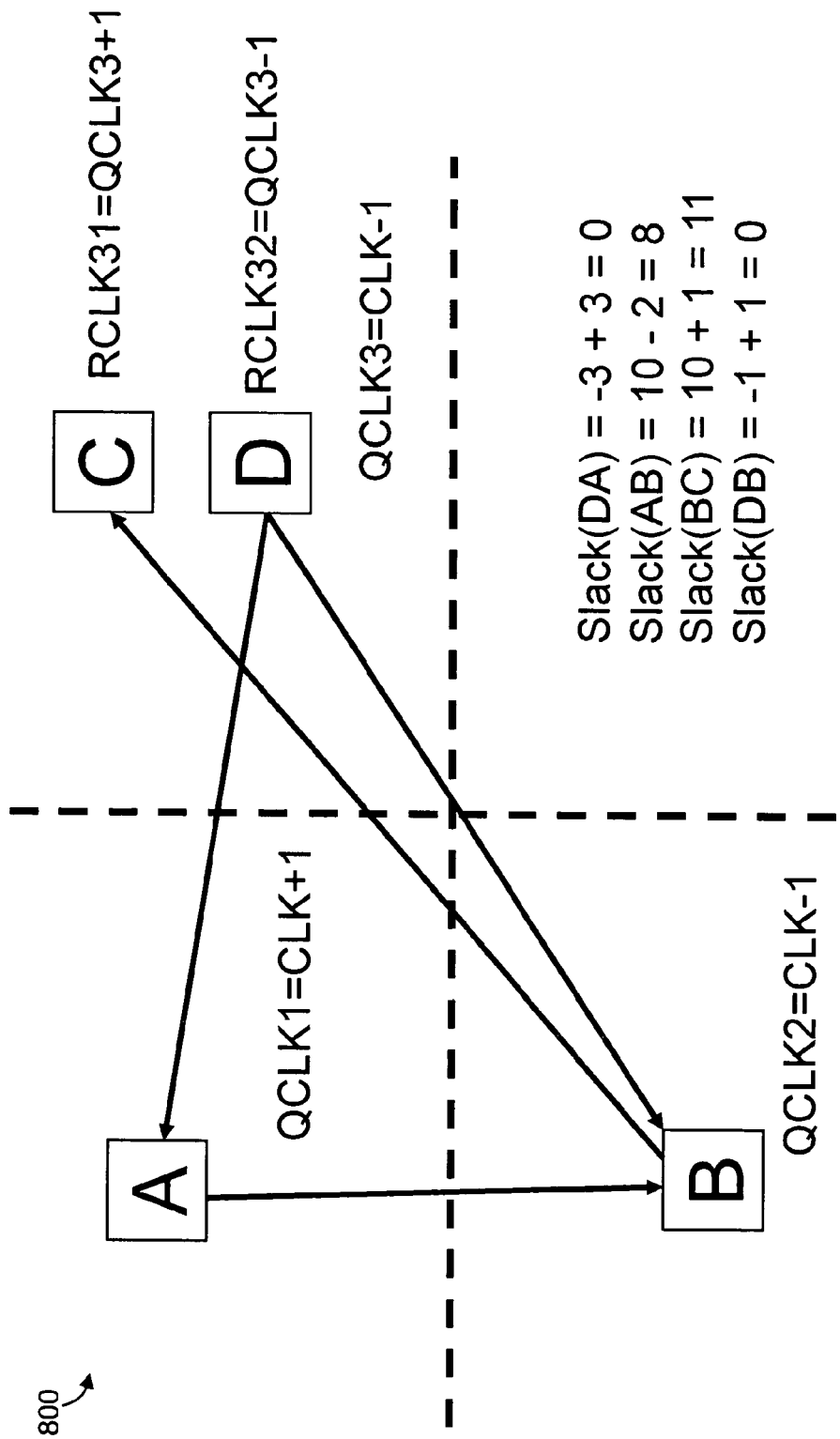
FIG. 8C illustrates the exemplary cyclic sequential machine of FIG. 8A with programmable skew applied to a first hierarchy and second hierarchy of the clocking network according to an embodiment of the present invention.

FIG. 8C illustrates the exemplary cyclic sequential machine of FIG. 8A with programmable skew applied to a first hierarchy and second hierarchy of the clocking network according to an embodiment of the present invention. In this embodiment, +1 unit of skew is introduced onto the row clock line 1 in quadrant 3, and −1 unit of skew is introduced on row clock 2 in quadrant 3. This results in beneficial skew of +3, +1, and +1 on the path between registers D and A, B and C, and D and B respectively. Detrimental skew of −2 is generated on the path between registers A and B. The slack value on the path between registers D and A, and D and B both improve from −1 to 0. The slack value on the path between registers B and C improves from 10 to 11. The slack value on the path between registers A and B remains the same.

It should be appreciated that a clock for a system may be defined with a clock signal that has a single unit of skew, +1, applied to a clock signal originating from a clock generator. In this embodiment, negative skew may be introduced to the clock signal when zero units of skew, 0, is applied to the clock signal originating from the clock generator.

Figure 9:
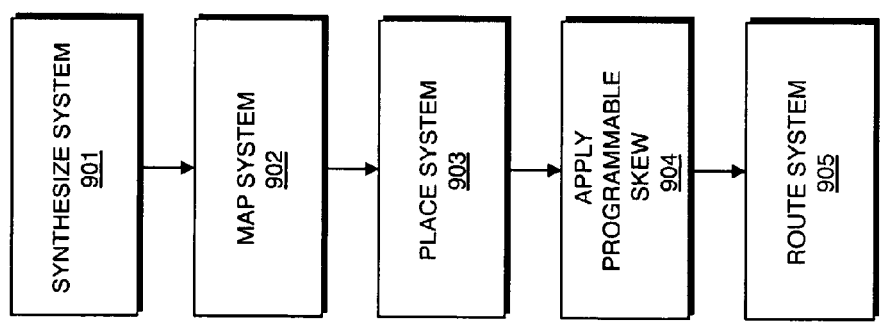
FIG. 9 is a flow chart illustrating a method for designing a system according to an embodiment of the present invention.

FIG. 9 is a flow chart illustrating a method for designing a system according to an embodiment of the present invention. The method may be performed with the assistance of an EDA tool, for example. At 901, synthesis is performed. Synthesis includes generating a logic design of the system to be implemented by a target device. According to an embodiment of the present invention, synthesis generates an optimized logical representation of the system from a Hardware Description Language (HDL) design definition. The optimized logical representation of the system may include a representation that includes a minimized number of logic gates and logic elements required for the system. Alternatively, the optimized logical representation of the system may include a representation that has a reduced depth of logic and that generates a lower signal propagation delay.

At 902, mapping is performed. Mapping includes determining how to implement the logic components such as logic gates in the optimized logical representation with general resources available on the target device. According to an embodiment of the present invention, a netlist is generated from mapping. The netlist illustrates how the general resources available on the target device are utilized to implement the system. The netlist may, for example, include a representation of the resources on the target device as nodes and how the nodes are connected. The netlist may be an optimized technology-mapped netlist generated from the HDL.

At 903, the mapped logical system design is placed. Placement works on the optimized technology-mapped netlist to produce a placement for each of the logic components. According to an embodiment of the present invention, placement includes fitting the system on the target device by determining the specific resources on the target device to be used for implementing the general resources mapped for logic components at 902. The placement procedure may be performed by a placer in an EDA tool that utilizes placement algorithms.

At 904, programmable clock skew is applied to the system. The system is analyzed to determine slack values of paths between registers. This may be achieved by determining current data delays, clock skews, and clock periods associated with registers. Clock skew is applied to the system where it may be improve the performance of the system from a clock speed perspective. According to an embodiment of the present invention, the nodes in any clock region are collapsed into a super node with worst-case slacks on edges. A retiming procedure is performed to set the global clocks. Using this as an initial fixed solution, iteration is performed on the regional clocks and continued on additional clocks down the hierarchy of the clocking network. According to an alternate embodiment of the present invention, edges are selected using a greedy algorithm and modify slacks on the edges until no further improvement can be found.

It should be appreciated that clock skew may also be applied to a system to manage power. Dynamic power consumed by an integrated circuit occurs during switching. When parts of a system switch at the same time, peak dynamic power may become an issue. By utilizing programmable clock skew, areas of a system which have slack in both directions may be modified to output their results at different points of time. This may allow the averaging of dynamic power consumption across time and reduce peak dynamic power. It should be appreciated that clock skew may also be applied to a system to decrease skew between registers with hold-time failures. Hold-time failures may be reduced by slowing down a clock pulse relative to a data pulse signal.

At 905, routing of the system is performed. During routing, routing resources on the target device are allocated to provide interconnections between logic gates, logic elements, and other components on the target device. The routing procedure may be performed by a router in an EDA tool that utilizes routing algorithms.

FIG. 9 is a flow chart illustrating an embodiment of the present invention. Some of the techniques illustrated in this figure may be performed sequentially, in parallel or in an order other than that which is described. For example, programmable clock skew may be applied to the system after synthesis, mapping, placement, and/or routing. It should be appreciated that not all of the techniques described are required to be performed, that additional techniques may be added, and that the illustrated technique may be substituted with other techniques.

Embodiments of the present invention may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMS, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense. Furthermore, the descriptions have referred to EDA tools, FPGAs and PLDs, however, the methods and apparatuses are applicable to other logic design styles/tools, type of devices, and types of designs.

What is claimed is:

1. A method for designing a system on a target device, comprising:
 synthesizing a logic design for the system on the target device;
 mapping the logic design on the target device;
 placing a mapped logic design on the target device; and
 introducing clock skew to a component in the mapped logic design by programming a skew generator units, that generates a first skewed clock signal and a second skewed clock signal for the component, to select one of the first skewed clock signal and the second skewed clock signal for the components, wherein at least one of the synthesizing, mapping, placing and introducing is performed by a processor.

2. The method of claim 1, wherein introducing clock skew allows the system to operate at a higher clock frequency.

3. The method of claim 1, wherein introducing clock skew reduces peak dynamic power of the system.

4. The method of claim 1, wherein introducing clock skew reduces hold-time failure by slowing down a clock pulse relative to a data pulse signal.

5. The method of claim 1, wherein the skew generator units comprises one or more discrete programmable delay elements that adds skew to a clock signal.

6. The method of claim 1, wherein the skew generator units is coupled to a clock line transmitting a clock signal, and the skew generator unit includes a first delay chain that adds a first amount of skew to the clock signal to generate the first skewed clock signal, and a second delay chain that adds a second amount of skew to the clock signal to generate the second skewed clock signal.

7. The method of claim 1, wherein the skew generator unit is coupled to a first clock line transmitting a first clock signal and a second clock line transmitting a second clock signal, and the skew generator unit includes a first delay chain that adds a first amount of skew to the first clock signal to generate the first skewed clock signal and a second delay chain that adds a second amount of skew to the second clock signal to generate the second skewed clock signal.

8. A non-transitory computer readable medium including a sequence of instructions stored thereon for causing a computer to execute a method comprising:
 introducing clock skew to a component in a mapped logic design by programming a skew generator unit, that generates a first skewed clock signal and a second skewed clock signal for the component, to select one of the first skewed clock signal and the second skewed clock signal for the component.

9. The non-transitory computer readable medium of claim 8, wherein the skew generator unit is coupled to a clock line, and the skew generator includes a first delay chain that adds a first amount of skew to a clock signal on the clock line to generate the first skewed clock signal, and a second delay chain that adds a second amount of skew to the clock signal to generate the second skewed clock signal.

10. The non-transitory computer readable medium of claim 8, wherein the clock line is a global clock line.

11. The non-transitory computer readable medium of claim 8, wherein the clock line is a regional clock line.

12. The non-transitory computer readable medium of claim 8, wherein the clock line is a row clock line.

13. The non-transitory computer readable medium of claim 8, wherein the clock line is a logic array block clock line.

14. The non-transitory computer readable medium of claim 8, wherein the skew generator unit is coupled to a first clock line and a second clock line, and the skew generator includes a first delay chain that adds a first amount of skew to the first clock line to generate the first skewed clock signal, and a second delay chain that adds a second amount of skew to the second clock line to generate the second skewed clock signal.

15. A system designer, comprising:
 a synthesis unit that synthesizes a logic design for a system on a target device;
 a mapping unit that maps the logic design on the target device;
 a placement unit that places a mapped logic design on the target device; and
 a programmable skew unit that introduces clock skew to a component in the mapped logic design by programming a skew generator unit, that generates a first skewed clock signal and a second skewed clock signal to the component, to select one of the first skewed clock signal and the second skewed clock signal for the component, wherein at least one of the synthesis unit, mapping unit, placement unit, and skew programming unit is performed by a processor.

16. The system designer of claim 15, wherein the programmable skew unit programs the skew generator unit by selecting one of a clock signal from a clock line, the first skewed clock signal from a first delay chain coupled to the clock line, and the second skewed clock signal from a second delay chain coupled to the clock line to output to the component.

17. The system designer of claim 15, wherein the programmable skew unit programs the skew generator unit by selecting one of a first clock signal from a first clock line, a second clock signal from a second clock line, the first skewed clock signal from a first delay chain coupled to the first clock line, and the second skewed clock signal from a second delay chain coupled to the second clock line to output to the component.

18. The system designer of claim 15, wherein the programmable skew unit programs the skew generator unit by selecting one of a first clock signal and a second clock signal to introduce skew to, and selecting one of the first skewed clock signal from a first delay chain and the second skewed clock signal from a second delay chain to output to the component.

* * * * *